US 008652258B2

(12) United States Patent
Yokogawa et al.

(10) Patent No.: US 8,652,258 B2
(45) Date of Patent: Feb. 18, 2014

(54) SUBSTRATE TREATMENT DEVICE

(75) Inventors: Takashi Yokogawa, Toyama (JP);
Yasuhiro Inokuchi, Toyama (JP);
Katsuhiko Yamamoto, Toyama (JP);
Yoshiaki Hashiba, Takaoka (JP);
Yasuhiro Ogawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/067,117

(22) Filed: May 10, 2011

(65) Prior Publication Data

US 2011/0212623 A1 Sep. 1, 2011

Related U.S. Application Data

(63) Continuation of application No. 11/979,816, filed on Nov. 8, 2007, now abandoned.

(30) Foreign Application Priority Data

Nov. 10, 2006 (JP) .................................. 2006-304936

(51) Int. Cl.
C23C 16/00 (2006.01)
C23C 16/455 (2006.01)
C23C 16/46 (2006.01)
C23C 16/52 (2006.01)
H01L 21/306 (2006.01)

(52) U.S. Cl.
USPC ...... 118/715; 118/724; 118/725; 156/345.29; 156/345.33; 156/345.26

(58) Field of Classification Search
USPC ........ 118/724, 725, 715; 156/345.26, 345.29, 156/345.33
See application file for complete search history.

(56) References Cited

U.S. PATENT DOCUMENTS 5,622,566 A 4/1997 Hosaka et al.
5,902,102 A * 5/1999 Nam et al. .................... 432/152

(Continued)

FOREIGN PATENT DOCUMENTS

JP A-03-016208 1/1991
JP A-04-139819 5/1992

(Continued)

OTHER PUBLICATIONS

Notice of Rejection for corresponding Japanese Application No. 2006-304936 issued Sep. 24, 2008 (w/English translation).

(Continued)

*Primary Examiner* — Jeffrie R Lund
(74) *Attorney, Agent, or Firm* — Oliff PLC

(57) ABSTRACT

It is intended to provide a substrate treatment device capable of adjusting both of a growth speed and an etching speed in a selective epitaxial growth, avoiding particle generation from nozzles, and achieving good etching characteristics. A substrate treatment device for selectively growing an epitaxial film on a surface of a substrate by alternately supplying a raw material gas containing silicon and an etching gas to a treatment chamber, the substrate treatment device being provided with a substrate support member for supporting the substrate in the treatment chamber, a heating member provided outside the treatment chamber for heating the substrate and an atmosphere of the treatment chamber, a gas supply system provided inside the treatment chamber, and a discharge port opened on the treatment chamber, wherein the gas supply system comprises first gas supply nozzles for supplying the raw material gas and second gas supply nozzles for supplying the etching gas.

4 Claims, 3 Drawing Sheets

(56) References Cited

U.S. PATENT DOCUMENTS

| | | | |
|---|---|---|---|
| 6,107,197 A | 8/2000 | Suzuki | |
| 6,503,330 B1* | 1/2003 | Sneh et al. | 118/715 |
| 6,686,281 B2* | 2/2004 | Yamazaki et al. | 438/680 |
| 6,807,971 B2* | 10/2004 | Saito et al. | 134/22.11 |
| 6,905,963 B2* | 6/2005 | Noda et al. | 438/684 |
| 8,039,404 B2* | 10/2011 | Miya et al. | 438/786 |
| 8,071,477 B2* | 12/2011 | Moriya et al. | 438/680 |
| 8,304,328 B2* | 11/2012 | Maeda et al. | 438/482 |
| 8,343,594 B2* | 1/2013 | Hasebe et al. | 427/579 |
| 8,409,352 B2* | 4/2013 | Kuribayashi et al. | 118/715 |
| 2003/0119288 A1* | 6/2003 | Yamazaki et al. | 438/565 |
| 2005/0124166 A1* | 6/2005 | Krishnaraj et al. | 438/694 |
| 2005/0287806 A1 | 12/2005 | Matsuura | |
| 2006/0110533 A1* | 5/2006 | Hwang et al. | 427/248.1 |
| 2006/0124058 A1* | 6/2006 | Sakai et al. | 118/715 |
| 2007/0006800 A1* | 1/2007 | Lee et al. | 117/95 |
| 2007/0034158 A1 | 2/2007 | Nakaiso | |
| 2008/0135516 A1* | 6/2008 | Yokogawa et al. | 216/37 |
| 2008/0274302 A1* | 11/2008 | Hasebe et al. | 427/579 |
| 2008/0314311 A1* | 12/2008 | Burrows et al. | 117/107 |
| 2009/0087964 A1* | 4/2009 | Maeda et al. | 438/482 |
| 2009/0136652 A1* | 5/2009 | Washington et al. | 427/8 |
| 2009/0176017 A1* | 7/2009 | Sakai et al. | 427/255.28 |
| 2009/0305517 A1* | 12/2009 | Nakashima et al. | 438/786 |
| 2010/0081288 A1* | 4/2010 | Nakaiso | 438/758 |
| 2010/0151682 A1* | 6/2010 | Moriya et al. | 438/680 |
| 2011/0186984 A1* | 8/2011 | Saito et al. | 257/734 |
| 2011/0212623 A1* | 9/2011 | Yokogawa et al. | 438/694 |
| 2011/0300722 A1* | 12/2011 | Sakai et al. | 438/791 |
| 2013/0068159 A1* | 3/2013 | Maeda et al. | 118/666 |

FOREIGN PATENT DOCUMENTS

| | | |
|---|---|---|
| JP | A-04-163912 | 6/1992 |
| JP | A-05-206106 | 8/1993 |
| JP | A-2000-068214 | 3/2000 |
| JP | A-2000-311860 | 11/2000 |
| JP | A-2002-134490 | 5/2002 |
| JP | A-2005-243924 | 9/2005 |
| JP | A-2007-042671 | 2/2007 |
| WO | WO 2007108401 * | 9/2007 |

OTHER PUBLICATIONS

Notice of Rejection for corresponding Japanese Application No. 2006-304936 issued Mar. 12, 2009 (pp. 1-4) (w/English translation).
Notice of Reasons for Rejection for Appln. No. 2006-304936, dated Sep. 24, 2008.
Notice of Reasons for Rejection for Appln. No. 2006-304936, dated Mar. 16, 2009.

* cited by examiner

SUBSTRATE TREATMENT DEVICE

This is a Continuation of application Ser. No. 11/979,816 filed Nov. 8, 2007. The disclosure of the prior applications is hereby incorporated by reference herein in its entirety.

BACKGROUND

1. Field of the Invention

This invention relates to a substrate treatment device to be used for a semiconductor production apparatus.

2. Description of the Related Art

A reaction furnace (treatment furnace) of a vertical low pressure CVD device used for selective epitaxial growth of Si or SiGe is formed of a reaction piping, an inlet flange, a seal cap, and the like, wherein a boat is placed on the seal cap, a wafer is placed on the boat, and the reaction furnace is heated by a heater.

In the above-mentioned structure, a gas serving as a raw material for the Si or SiGe selective epitaxial growth is introduced from an upper part of the reaction furnace through a nozzle and discharged from a lower part. Accordingly, in a reaction atmosphere where the wafer is present, the gas flows from the top to the bottom.

In this case, the heater heating the reaction furnace is divided into five regions of an upper heater, a central upper heater, a central heater, a central lower heater, and a lower heater, and a temperature gradient (temperature inclination) is set for the five divisional heaters in such a manner that the lower the region the higher is the temperature. A reduction in growth speed at the discharge side (the lower part of the reaction furnace), which is caused by consumption of the reaction gas, is corrected by the temperature gradient.

In the Si or SiGe selective epitaxial growth, a method of alternately supplying a raw material gas and an etching gas is employed. In the case of the method of alternately supplying a raw material gas and an etching gas, since the raw material gas supply and the etching gas supply are performed under an identical temperature, only one of a growth speed and an etching speed is adjusted by the temperature gradient of the heaters. That is, in the case where the temperature gradient is so set as to adjust the growth speed, the etching speed is decided in accordance with the temperature gradient. In the case where the temperature gradient is so set as to adjust the etching speed, the growth speed is decided in accordance with the temperature gradient.

Also, when the raw material gas and the etching gas are supplied from an identical nozzle, a film that is formed due to self-decomposition of the raw material gas deposits inside the nozzle, and particle generation and etching gas consumption are undesirably caused when the etching gas is fed through such nozzle.

SUMMARY

This invention has been accomplished for the purpose of solving the above-described problems, and an object thereof is to provide a substrate treatment device that enables adjustment of both of a growth speed and an etching speed and is capable of suppressing particle generation.

In order to solve the above-described problems, this invention is characterized by a substrate treatment device at least using a Si-containing gas and a $Cl_2$ gas and alternately supplying the Si-containing gas and the $Cl_2$ gas to a treatment chamber for selectively growing an epitaxial film on a surface of a substrate housed in the treatment chamber, comprising: a substrate support member for supporting the substrate in the treatment chamber; a heating member provided outside the treatment chamber for heating the substrate and an atmosphere of the treatment chamber; a gas supply system provided inside the treatment chamber; and a discharge port opened on the treatment chamber, wherein: the gas supply system comprises a first gas supply member for supplying the Si-containing gas and a second gas supply member for supplying the $Cl_2$ gas different from the first gas supply member; and each of the first gas supply member and the second gas supply member comprises a plurality of gas supply nozzles for separately supplying the Si-containing gas and the $Cl_2$ gas to a plurality of different parts of the treatment chamber.

According to this invention, since it is possible to adjust both of a growth speed and an etching speed, it is possible to avoid particle generation and to achieve good etching characteristics.

DETAILED DESCRIPTION OF EMBODIMENTS

One embodiment of this invention will be described below based on the drawings.

Figure 1:
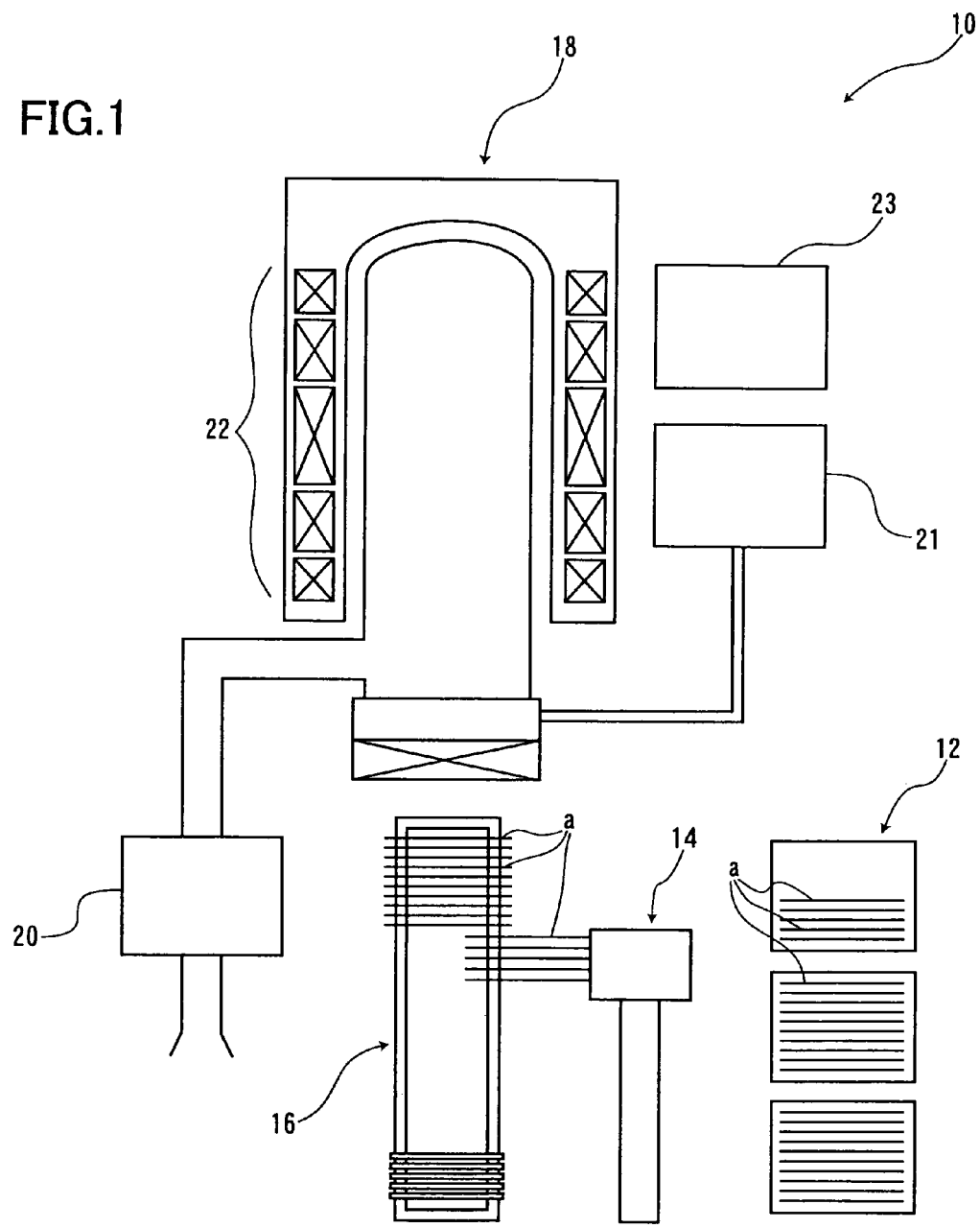
FIG. 1 is a schematic diagram showing a structure of a substrate treatment device according to one embodiment of this invention.

Shown in FIG. 1 is a schematic diagram of a substrate treatment device 10 according to one embodiment of this invention. The substrate treatment device 10 is a so-called hot wall type vertical low pressure CVD device.

As shown in FIG. 1, wafers (Si substrates) a conveyed by a wafer cassette 12 are transferred onto a boat 16 from the wafer cassette 12 by a transfer machine 14. When transfer of all of the wafers a is finished, the boat 16 is inserted into a treatment furnace 18, and then the treatment furnace 18 is reduced in pressure by an evacuation system 20. Subsequently, a temperature inside the treatment furnace 18 is increased to a desired temperature by a heater 22, and, when the temperature becomes stable, a raw material gas and an etching gas are alternately supplied from a gas supply system 21 to cause selective epitaxial growth of Si, SiGe, or the like on the wafers a. Denoted by 23 is a control system for controlling insertion of the boat 16 into the treatment furnace 18, rotation of the boat 16, evacuation by the evacuation system 20, gas supply from the gas supply system 21, heating by the heater 22, and the like.

As the raw material gas for the Si or SiGe selective epitaxial growth, a Si-containing gas such as $SiH_4$, $Si_2H_6$, and $SiH_2Cl_2$ may be used. In the case of the SiGe selective epitaxial growth, a Ge-containing gas such as $GeH_4$ and $GeCl_4$ may be added. In the CVD reaction, the growth starts on Si immediately after the introduction of the raw material gas, but a delay in growth called an incubation period occurs on $SiO_2$ or $Si_3N_4$. The selective growth means the growth of Si or SiGe caused only on Si during the incubation period. During the selective growth, Si nuclei adhere to $SiO_2$ or $Si_3N_4$ to diminish the selectivity. Therefore, the etching gas is supplied after the raw material gas supply in order to eliminate the Si nuclei adhered to $SiO_2$ or $Si_3N_4$. The selective epitaxial growth is performed by alternating the gas supplies.

Hereinafter, details of a structure after the insertion of the boat 16 of the treatment furnace 18 to be used for the substrate treatment device 10 according to one embodiment of this invention will be described based on the drawings.

Figure 2:
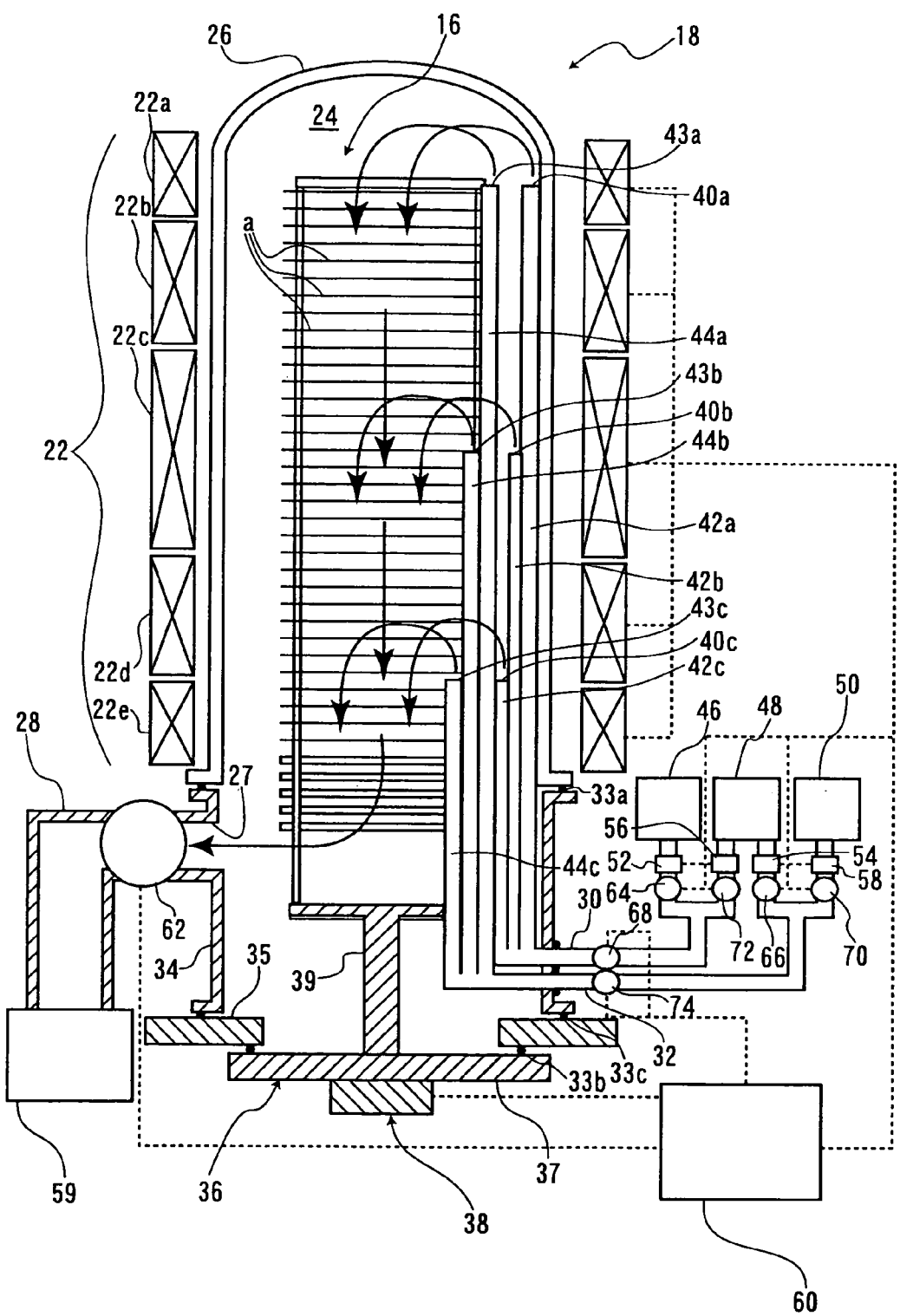
FIG. 2 is a longitudinal sectional view showing a structure of a treatment furnace of the substrate treatment device according to the embodiment of this invention.

FIG. 2 is a schematic block diagram which is a longitudinal sectional view showing the treatment furnace 18 after the insertion of the boat 16 according to one embodiment of this invention.

As shown in FIG. 2, the treatment furnace 18 is provided with a reaction piping 26 that forms a treatment chamber 24 and formed of an outer tube, for example, a gas discharge piping 28 disposed under the reaction piping 26 for discharging gases from a discharge port 27, a first gas supply piping 30 for supplying the raw material gas and the like to the treatment chamber 24, a second gas supply piping 32 for supplying the etching gas and the like, a manifold 34 connected to the reaction piping 26 via an O-ring 33a, a sealing cap 36 for closing a lower end of the manifold 34 to seal the treatment chamber 24 via O-rings 33b and 33c, the boat 16 serving as a wafer retaining body (substrate support member) for retaining (supporting) the wafers (Si substrates) a in a multistage state, a rotation mechanism 38 for rotating the boat 16 at a predetermined number of rotations, and the heater (heating member) 22 formed of a heater wire (not shown) and a heat insulating member for heating the wafers a outside the reaction piping 26.

The reaction piping 26 is formed from a heat insulating material such as quartz ($SiO_2$) and silicon carbide (SiC) and has a cylindrical shape wherein an upper end is closed and a lower end is opened. The manifold 34 is made from a stainless steel or the like, for example, and has a cylindrical shape wherein an upper end and a lower end are opened. The upper end of the manifold 34 is coupled to the reaction piping 26 via the O-ring 33a, and the first gas supply piping 30 and the second gas supply piping 32 are attached as penetrating through the manifold 34. The sealing cap 36 is made from a stainless steel or the like, for example, and formed of a ring-like part 35 and a circular part 37 to close the lower end of the manifold 34 via the O-rings 33b and 33c. The boat 16 is made from a heat insulating material such as quartz and silicon carbide and has a structure of retaining the plural wafers a in such a state that the wafers a keep a horizontal posture and drawn up with centerlines being aligned. The rotation mechanism 38 of the boat 16 is connected to the boat 16 by a rotation shaft 39 penetrating through the sealing cap 36, so that the wafers a are rotated when the boat 16 is rotated.

The heater 22 is divided into 5 regions of an upper heater 22A, a central upper heater 22B, a central heater 22C, a central lower heater 22D, and a lower heater 22E, and each of the heater regions has a cylindrical shape.

In the treatment furnace 18 according to one embodiment of this invention, three first gas supply nozzles 42a, 42b, and 42c branched from the first gas supply piping 30 and having first gas supply apertures 40a, 40b, and 40c that are different in height and three second gas supply nozzles 44a, 44b, and 44c branched from the second gas supply piping 32, having second gas supply apertures 43a, 43b, and 43c that are different in height, and formed separately from the first gas supply nozzles 42a, 42b, and 42c are provided as a gas supply unit.

In the above-described structure of the treatment furnace 18, the treatment gas is supplied from a raw material gas supply source 46 for supplying the raw material gas (e.g. $SiH_4$ gas), a purge gas supply source 48 for supplying a purge gas (e.g. $H_2$ gas), an etching gas supply source 50 for supplying the etching gas (e.g. $Cl_2$ gas), for example. In a film formation step, the raw material gas and the purge gas are introduced into the treatment chamber 24 separately through the first gas supply piping 30 and the second gas supply piping 32 after flow rates of the gases are independently adjusted by a first MFC (mass-flow controller) 52 serving as a unit for controlling the flow rate of the raw material gas from the raw material gas supply source 46 and a second MFC 54 serving as a unit for controlling the flow rate of the purge gas from the purge gas supply source 48. The raw material gas is supplied to three parts of an upper part, a center part, and a lower part of the boat 16 by the first gas supply nozzles 42a, 42b, and 42c branched from the first gas supply piping 30, while the purge gas is supplied to the three parts of the upper part, the center part, and the lower part of the boat 16 by the second gas supply nozzles 44a, 44b, and 44c branched from the second gas supply piping 32.

During an etching step, the purge gas and the etching gas are introduced into the treatment chamber 24 separately through the first gas supply piping 30 and the second gas supply piping 32 after flow rates of the gases are independently adjusted by a third MFC 56 serving as a unit for controlling the flow rate of the purge gas from the purge gas supply source 48 and a fourth MFC 58 serving as a unit for controlling the flow rate of the etching gas from the etching gas supply source 50. The purge gas is supplied to the three parts of the upper part, the center part, and the lower part of the boat 16 by the first gas supply nozzles 42a, 42b, and 42c branched from the first gas supply piping 30, while the etching gas is supplied to the three parts of the upper part, the center part, and the lower part of the boat 16 by the second gas supply nozzles 44a, 44b, and 44c branched from the second gas supply piping 32.

The atmosphere inside the treatment chamber 24 is evacuated by an evacuation unit (e.g. vacuum pump 59) connected to the gas discharge piping 28 from the treatment chamber 24.

Hereinafter, one example of wafer treatment by the substrate treatment device 10 according to one embodiment of this invention will be described.

As shown in FIG. 2, the boat 16 retaining the untreated wafers a is inserted into the treatment chamber 24 by driving of an elevation motor (not shown). An evacuation valve 62 is opened by a command from the control device 60 to evacuate the atmosphere in the treatment chamber 24, thereby reducing a pressure of the treatment chamber 24. The heater 22 is controlled by the control device 60 so as to maintain a temperature of the treatment chamber 24, i.e. a temperature of the wafers a, to a desired temperature. The rotation mechanism 38 is driven by a command from the control device 60 so that the boat 16 is rotated at the predetermined number of rotations.

Next after degrees of opening of the first MFC 52 and the second MFC 54 are adjusted by a command from the control device 60, a first valve 64 opening/closing for supplying the raw material gas from the raw material gas supply source 46 and a second valve 66 for supplying the purge gas from the purge gas supply source 48 are opened. Subsequently, a third valve 68 is opened to introduce the raw material gas into the treatment chamber 24 through the first gas supply piping 30 and the first gas supply nozzles 42a, 42b, and 42c to treat the wafers a. Simultaneously, a sixth valve 74 is opened to introduce the purge gas into the treatment chamber 24 through the second gas supply piping 32 and the second gas supply nozzles 44a, 44b, and 44c.

Next, after degrees of opening of the third MFC 56 and the fourth MFC 58 are adjusted by a command from the control device 60, a fourth valve 70 opening/closing for supplying the etching gas from the etching gas supply source 50 and a fifth valve 72 for supplying the purge gas from the purge gas supply source 48 are opened. Subsequently, the sixth valve 74 is opened to introduce the etching gas into the treatment chamber 24 through the second gas supply piping 32 and the second gas supply nozzles 44a, 44b, and 44c to treat the wafers a. Simultaneously, the third valve 68 is opened to introduce the purge gas into the treatment chamber 24 through the first gas supply piping 30 and the first gas supply nozzles 42a, 42b, and 42c.

As described above, in the substrate treatment device 10 according to one embodiment of this invention, the raw material gas is supplied to the treatment chamber 24 through the first gas supply piping 30 and the first gas supply nozzles 42a, 42b, and 42c separately from the etching gas supplied to the treatment chamber 24 through the second gas supply piping 32 and the second gas supply nozzles 44a, 44b, and 44c. Therefore, though only one of the growth speed and the etching speed has been adjusted in the conventional method of setting the temperature gradient, since the substrate treatment device 10 according to one embodiment of this invention is capable of supplying the raw material gas and the etching gas separately from each other through the plural nozzles that are provided independently for each of the raw material gas and the etching gas, it is possible to adjust both of the growth speed and the etching speed by adjusting the supply rates of the raw material gas and the etching gas.

Also, in the case of supplying the raw material gas and the etching gas from an identical nozzle, a film deposits inside the nozzle due to self-decomposition of the raw material gas, and particle generation and etching gas consumption are caused when the etching gas is fed through the nozzle. In contrast, in the substrate treatment device 10 according to one embodiment of this invention, since the raw material gas is supplied from the plural nozzles that are different from the plural nozzles used for supplying the etching gas, it is possible to avoid the particle generation from the nozzles. Further, since no film deposits on inner walls of the second gas supply nozzles 44a, 44b, and 44c for supplying the etching gas, the etching gas is not consumed in the second gas supply nozzles 44a, 44b, and 44c, thereby making it possible to achieve good etching characteristics as well as to ensure a stable etching rate for the wafers a irrespective of the inner wall state of the first gas supply nozzles 42a, 42b, and 42c and the second gas supply nozzles 44a, 44b, and 44c.

Furthermore, since each of the gases is supplied from the plural nozzles that are different in height and provided independently for each of the gases in the substrate treatment device 10 according to one embodiment of this invention, the substrate treatment device 10 is capable of adjusting a reduction in growth speed, which is aggravated as a distance between the discharge side (the lower part inside the treatment furnace 18) and the wafer is reduced due to consumption of the reaction gas, by supplying the gas between the upper part and the lower part of the treatment furnace 18, thereby making it possible to set a growth speed at a temperature close to the treatment temperature upper limit as the standard as well as to realize a growth speed larger than that achieved by setting the temperature gradient.

Since the purge gas such as a hydrogen gas is fed during the film formation (raw material gas supply) through the second gas supply nozzles 44a, 44b, and 44c that are used for the etching gas as described above, it is possible to prevent entrance of the gas and film deposition on the inner walls in the second gas supply nozzles 44a, 44b, and 44c. Likewise, since the purge gas is fed during the etching (etching gas supply) through the first gas supply nozzles 42a, 42b, and 42c that are used for the raw material gas, it is possible to prevent entrance of the etching gas in the first gas supply nozzles 42a, 42b, and 42c.

Figure 3:
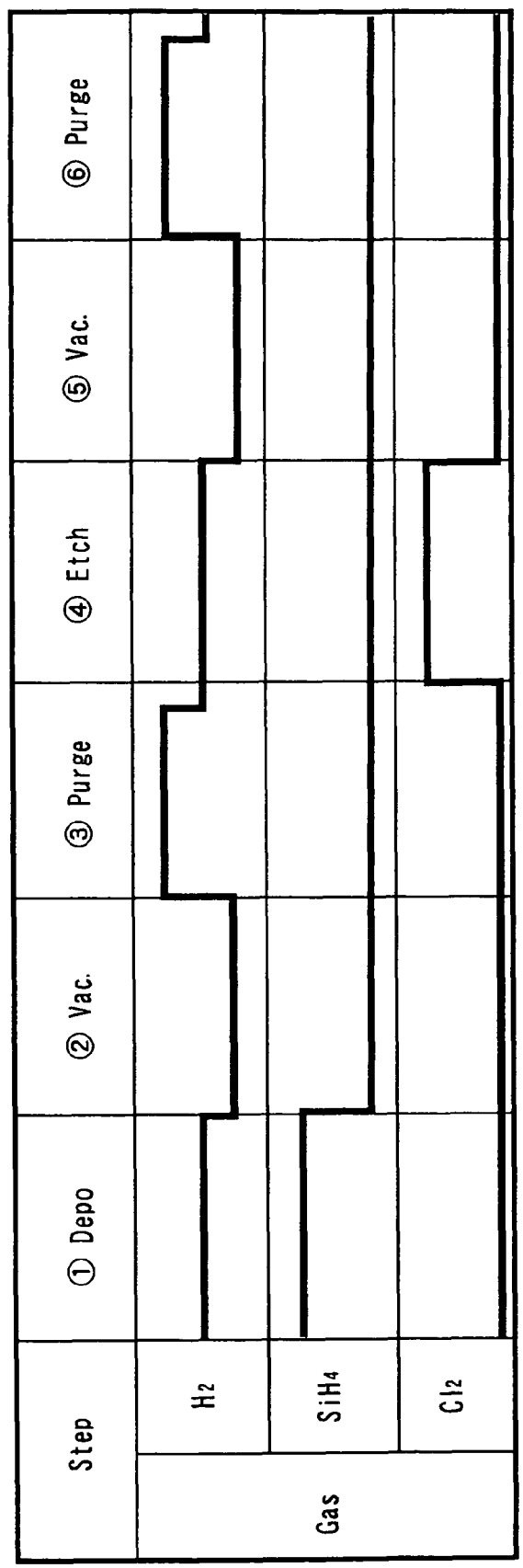
FIG. 3 is diagram showing a flow of specific steps for a selective epitaxial growth of a Si film using the substrate treatment device according to the embodiment of this invention.

One example of specific flow of steps of the selective epitaxial growth of a Si film using the substrate treatment device 10 according to one embodiment this invention will be described based on FIG. 3.

(1) A monosilane ($SiH_4$) gas which is the raw material gas is supplied to the treatment chamber 24 through the first gas supply piping 30 and the first gas supply nozzles 42a, 42b, and 42c (film formation step). During the film formation step, a hydrogen ($H_2$) gas which is the purge gas is supplied to the treatment chamber 24 through the second gas supply piping 32 and the second gas supply nozzles 44a, 44b, and 44c.

(2) The gas supplies are stopped to evacuate the treatment chamber 24.

(3) The $H_2$ gas which is the purge gas is supplied to the treatment chamber 24 through both of the first gas supply piping 30 and the first gas supply nozzles 42a, 42b, and 42c and the second gas supply piping 32 and the second gas supply nozzles 44a, 44b, and 44c (purge step).

(4) A chlorine ($Cl_2$) gas which is the etching gas is supplied to the treatment chamber 24 through the second gas supply piping 32 and the second gas supply nozzles 44a, 44b, and 44c (etching step). During the etching step, the $H_2$ gas which is the purge gas is supplied to the treatment chamber 24 through the first gas supply piping 30 and the first gas supply nozzles 42a, 42b, and 42c.

(5) The gas supplies are stopped to evacuate the treatment chamber 24.

(6) The $H_2$ gas which is the purge gas is supplied to the treatment chamber 24 through both of the first gas supply piping 30 and the first gas supply nozzles 42a, 42b, and 42c and the second gas supply piping 32 and the second gas supply nozzles 44a, 44b, and 44c (purge step).

By performing the selective epitaxial growth of the Si film on the wafers a by repeating the steps (1) to (6) with the steps (1) to (6) being used as one cycle, it is possible to adjust both of the growth speed and the etching speed as well as to avoid the particle generation, thereby achieving good etching characteristics.

As described in the foregoing, according to this invention, it is possible to provide the substrate treatment device capable of adjusting both of the growth speed and the etching speed in the Si or SiGe selective epitaxial growth, avoiding the particle generation from nozzles, and achieving good etching characteristics.

What is claimed is:

1. A substrate treatment device configured to alternately supply a Si-containing gas and a Ge-containing gas as a raw material gas and an etching gas to a treatment chamber for selectively growing an epitaxial film on a surface of a substrate housed in the treatment chamber, comprising:
a substrate support member for supporting the substrate in the treatment chamber;
a heating member provided outside the treatment chamber for heating the substrate and an atmosphere of the treatment chamber;
a first gas supply pipe connected to a raw material gas supply source and a purge gas supply source and not connected to an etching gas supply source;
a second gas supply pipe connected to the etching gas supply source and the purge gas supply source and not connected to the raw material gas supply source;
a plurality of first gas supply nozzles branched off from the first gas supply pipe and opened at a plurality of different heights of the treatment chamber, and configured to supply the raw material gas and a purge gas to the treatment chamber;

a plurality of second gas supply nozzles branched off from the second gas supply pipe and opened at a plurality of different heights of the treatment chamber, and configured to supply the etching gas and the purge gas to the treatment chamber;

a discharge port opened on the treatment chamber; and a control device configured to control the supply of gas to the first gas supply nozzles and the second gas supply nozzles, wherein:

the control device is configured to control the supply of gas such that the purge gas is supplied to the second gas supply nozzles so that the raw material gas does not go into the second gas supply nozzles when the raw material gas is supplied to the first gas supply nozzles and the purge gas is supplied to the first gas supply nozzles so that the etching gas does not go into the first gas supply nozzles when the etching gas is supplied to the second gas supply nozzles.

2. The substrate treatment device according to claim 1, wherein the first gas supply pipe and the second gas supply pipe are connected to the same purge gas supply source.

3. A substrate treatment device configured to alternately supply a Si-containing gas and a Ge-containing gas as a raw material gas and an etching gas to a treatment chamber for selectively growing an epitaxial film on a surface of a substrate housed in the treatment chamber, comprising:

a substrate support member for supporting the substrate in the treatment chamber;

a heating member provided outside the treatment chamber for heating the substrate and an atmosphere of the treatment chamber;

a first gas supply pipe connected to a raw material gas supply source and a purge gas supply source and not connected to an etching gas supply source;

a second gas supply pipe connected to the etching gas supply source and the purge gas supply source and not connected to the raw material gas supply source;

a plurality of first gas supply nozzles branched off from the first gas supply pipe and opened at a plurality of different heights of the treatment chamber, and configured to supply the raw material gas and a purge gas to the treatment chamber;

a plurality of second gas supply nozzles branched off from the second gas supply pipe and opened at a plurality of different heights of the treatment chamber, and configured to supply the etching gas and the purge gas to the treatment chamber;

a discharge port opened on the treatment chamber; and a control device configured to control the supply of gas to the first gas supply nozzles and the second gas supply nozzles, wherein:

the control device is configured to control the supply of gas such that the purge gas is fed through the second gas supply nozzles so that the raw material gas does not go into the second gas supply nozzles during film formation from the raw material gas being supplied to the treatment chamber and the purge gas is supplied to the first gas supply nozzles so that the etching gas does not go into the first gas supply nozzles during etching from the etching gas being supplied to the treatment chamber.

4. The substrate treatment device according to claim 3, wherein the first gas supply pipe and the second gas supply pipe are connected to the same purge gas supply source.

* * * * *